United States Patent
Jou et al.

(10) Patent No.: US 8,129,817 B2
(45) Date of Patent: Mar. 6, 2012

(54) REDUCING HIGH-FREQUENCY SIGNAL LOSS IN SUBSTRATES

(75) Inventors: Chewn-Pu Jou, Hsin-Chu (TW); Ho-Hsiang Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 12/347,208

(22) Filed: Dec. 31, 2008

(65) Prior Publication Data

US 2010/0164069 A1 Jul. 1, 2010

(51) Int. Cl.
*H01L 21/70* (2006.01)
(52) U.S. Cl. .. 257/544; 257/545; 257/547; 257/E29.019
(58) Field of Classification Search .................. 257/544, 257/545, 547, E29.019
See application file for complete search history.

(56) References Cited

U.S. PATENT DOCUMENTS

| 5,326,867 | A | 7/1994 | Okuyama et al. |
| 5,705,963 | A | 1/1998 | Ikeda et al. |
| 6,201,289 | B1 * | 3/2001 | Jou .............................. 257/531 |
| 6,373,121 | B1 | 4/2002 | Pan |
| 6,396,084 | B1 * | 5/2002 | Park et al. ..................... 257/107 |
| 6,881,986 | B1 * | 4/2005 | Chiou et al. .................. 257/184 |
| 6,956,189 | B1 | 10/2005 | Verhagen |
| 7,061,067 | B2 * | 6/2006 | Tanaka et al. ................. 257/484 |
| 7,557,428 | B2 | 7/2009 | Kunitomo et al. |

FOREIGN PATENT DOCUMENTS

| CN | 1815738 A | 8/2006 |
| JP | 6184048 A | 7/1994 |

* cited by examiner

*Primary Examiner* — Zandra Smith
*Assistant Examiner* — Paul Patton
(74) *Attorney, Agent, or Firm* — Steven H. Slater

(57) ABSTRACT

An integrated circuit structure includes a semiconductor substrate of a first conductivity type; and a depletion region in the semiconductor substrate. A deep well region is substantially enclosed by the depletion region, wherein the deep well region is of a second conductivity type opposite the first conductivity type. The depletion region includes a first portion directly over the deep well region and a second portion directly under the deep well region. An integrated circuit device is directly over the depletion region.

24 Claims, 8 Drawing Sheets

REDUCING HIGH-FREQUENCY SIGNAL LOSS IN SUBSTRATES

TECHNICAL FIELD

This invention relates generally to integrated circuits, and more particularly to high-frequency integrated circuit devices, and even more particularly to the structures for reducing signal loss in substrates and methods for forming the same.

BACKGROUND

High-frequency circuits are commonly used in modern applications such as wireless communication applications. A common problem faced by designers is the signal loss in the substrates that are underlying the high-frequency circuits, which signal loss is partially caused by the parasitic capacitors formed between the high-frequency circuits and the underlying substrates. Typically, with the increase in the frequency of the signals, the loss also increases. This significantly limits the design of high-frequency circuits.

FIG. 1 illustrates conventional radio frequency (RF) transformer 4 formed over semiconductor substrate 2. Dielectric layer(s) 8 separates RF transformer 4 from semiconductor substrate 2. RF transformer 4 forms parasitic capacitors 6 with semiconductor substrate 2. The undesirable parasitic capacitors 6 limit the operation frequency of RF transformer 4 to about 10 GHz and below. When the frequency is further increased, the signal loss in semiconductor substrate 2 significantly increases.

The signal loss also occurs to other integrated circuit devices when these devices are operated under high frequencies. For example, FIG. 2 illustrates junction diode 12, which is formed between P+ diffusion region 14 and N-well region 16. P+ diffusion region 14 and N-well region 16 are both formed in substrate 18. Again, parasitic capacitors 20 are formed between P+ diffusion region 14, N-well region 16 and substrate 18, and between substrate 18 and metal lines 22 that are connected to junction diode 12, and the like. Parasitic capacitors 20 result in significant signal loss in the signal carried by junction diode 12, which loss may be as severe as about 4 to 5 decibels. Similarly, other diodes such as FinFET diodes and Schottky diodes also suffer from similar problems.

Further, the signal loss problem may be worsened by the increasing down-scaling of integrated circuits, which causes the distances between the high-frequency devices and the respective underlying substrates to be increasingly smaller. The reduced distances result in the increase in parasitic capacitances. Solutions are thus needed to solve the above-discussed problems.

SUMMARY OF THE INVENTION

In accordance with one aspect of the present invention, an integrated circuit structure includes a semiconductor substrate of a first conductivity type; and a depletion region in the semiconductor substrate. A deep well region is substantially enclosed by the depletion region, wherein the deep well region is of a second conductivity type opposite the first conductivity type. The depletion region includes a first portion directly over the deep well region and a second portion directly under the deep well region. An integrated circuit device is directly over the depletion region. Other embodiments are also disclosed.

The advantageous features of the embodiments include reduced signal loss for high-frequency devices. In addition, the embodiments may be integrated with existing manufacturing processes without requiring excess process steps and lithography masks.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel substrate-loss reduction structure and the method of forming the same are presented. The intermediate stages of manufacturing embodiments of the present invention are discussed. The variations of the embodiments are also discussed. Throughout the various views and illustrative embodiments of the present invention, like reference numbers are used to designate like elements.

Figure 1:
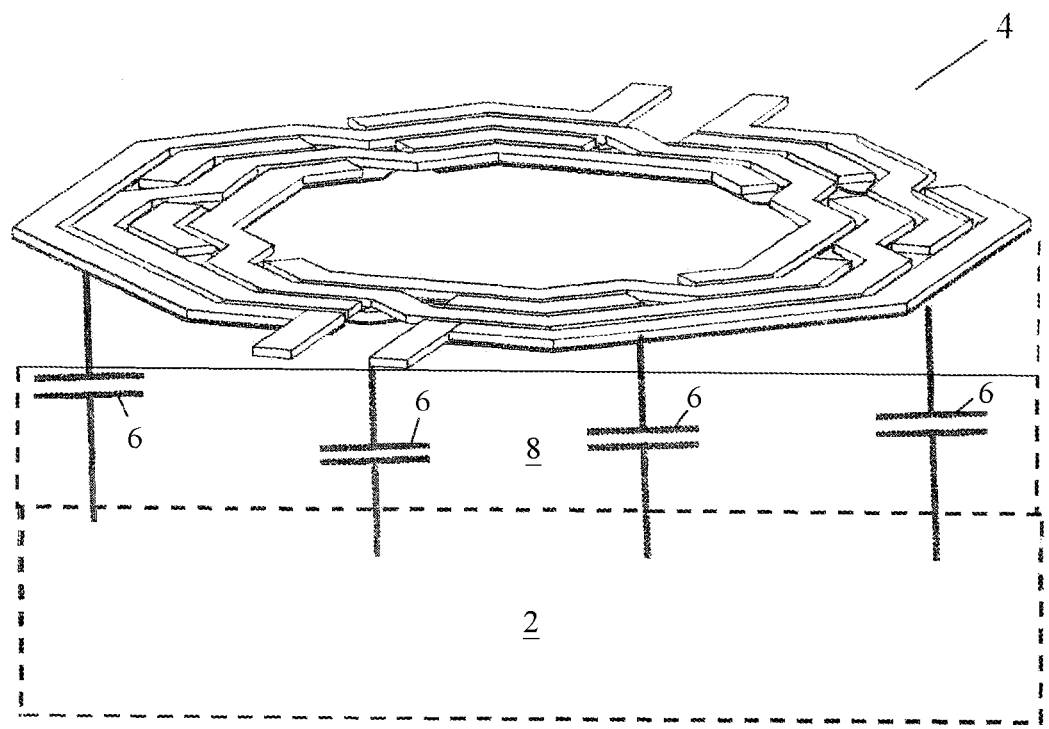
FIG. 1 illustrates a conventional radio frequency (RF) transformer formed over a semiconductor substrate.
Figure 2:
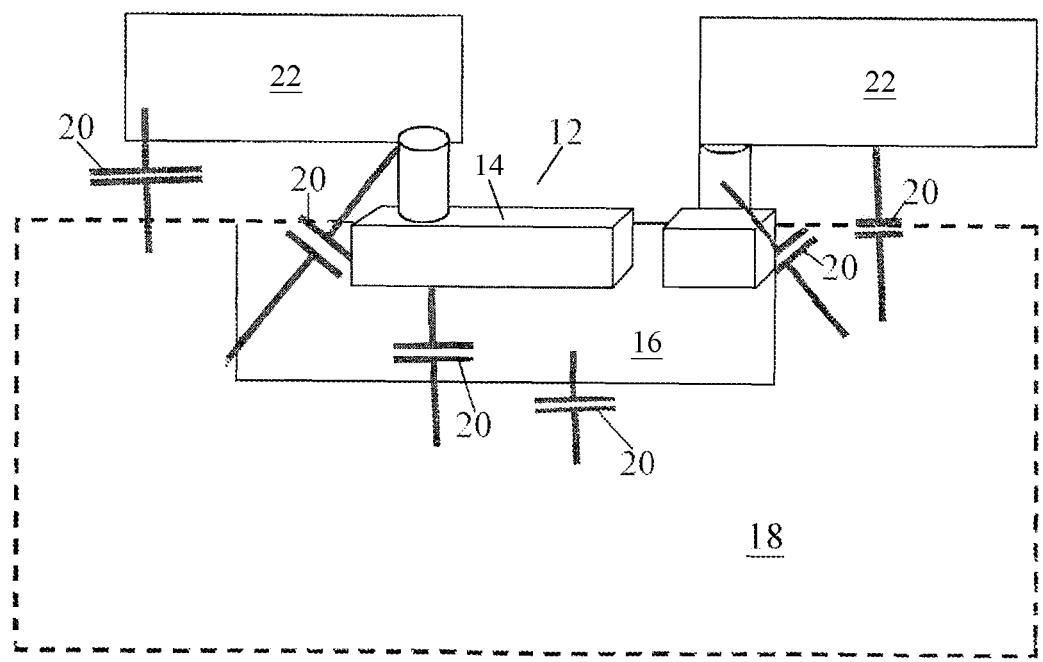
FIG. 2 illustrates a conventional diode formed over a semiconductor substrate.
Figure 3A:
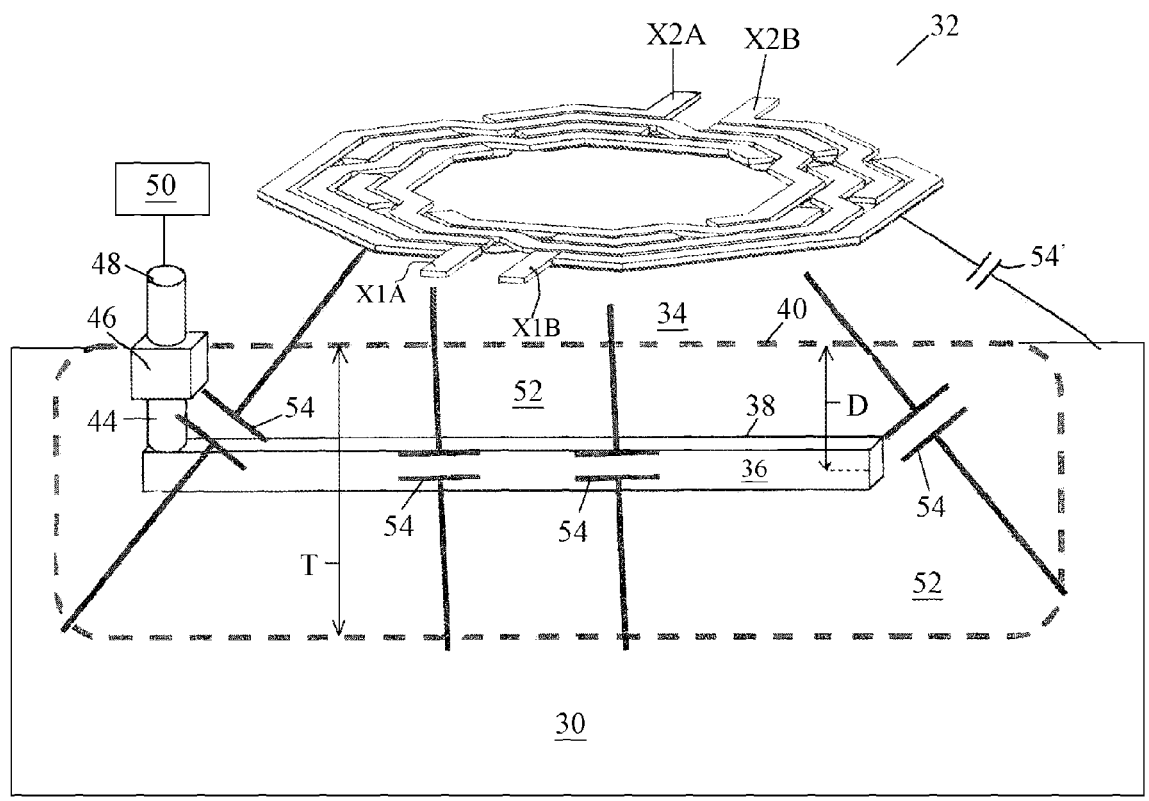
FIGS. 3A and 3B illustrate a perspective view and a top view of a transformer embodiment of the present invention, respectively.

FIG. 3A illustrates a perspective view of an embodiment of the present invention, which includes substrate 30. Substrate 30 may be a semiconductor substrate comprising silicon, germanium, GaAs, and/or other commonly used semiconductor materials. Substrate 30 may be a bulk substrate or have a semiconductor-on-insulator structure. In an embodiment, substrate 30 is lightly doped with a p-type impurity, for example, with a concentration of lower than about $10^{11}/cm^3$, and hence is referred to as being a P− substrate hereinafter. Alternatively, substrate 30 may be lightly doped with an n-type impurity. Radio frequency (RF) transformer 32 is formed over substrate 30. Space 34 between RF transformer 32 and substrate 30 may include dielectric layers such as inter-layer dielectric (ILD), in which gate electrodes of transistors (not shown) and contact plug 48 are formed, and possibly inter-metal dielectrics (IMDs), in which metal lines and vias (not shown) are formed.

Transformer 32 may have four terminals, namely X1A, X1B, X2A, and X2B. Terminals X1A and X2A are interconnected through metal lines and vias. Terminals X1B and X2B are interconnected through metal lines and vias. Accordingly, transformer 32 includes two inductors, with one connected between terminals X1A and X2A, and the other connected between terminals X1B and X2B.

Deep N-well region(s) 36 is formed in substrate 30, and has top surface 38 lower than top surface 40 of substrate 30. In an embodiment, deep N-well region 36 is formed by implanting an n-type impurity, such as phosphorous or arsenic, deeply into substrate 30. Alternatively, deep N-well region 36 may be formed by diffusing or doping a surface layer of substrate 30 to form deep N-well region 36, and then epitaxially growing a p-type layer over deep N-well region 36. Accordingly, deep N-well region 36 is buried inside substrate 30, with a p-layer over deep N-well region 36. It is appreciated that due to the distribution of the implanted n-type impurity, deep N-well region 36 may not have sharp top and bottom surfaces. In an exemplary embodiment, a middle level of deep N-well region 36, which is between the top and bottom surface of deep N-well region 36, has depth D of about 1 µm. One skilled in the art will realize, however, that the dimensions recited throughout the description are merely examples, and will change if different formation technologies are used.

Deep N-well region 36 is connected to voltage source 50 through n-type plug 44, n-type plug 46, and contact plug 48. In an embodiment, n-type plug 44 is formed simultaneously with n-well regions, which are used for forming pMOS transistors (not shown) therein. Accordingly, n-type plug 44 has substantially the same impurity concentration as the n-well regions. Top surface 38 of deep N-well region 36 is no lower than the bottom surface of the n-type plug 44 so that they join each other. N-type plug 46 may be formed simultaneously with the formation of source/drain regions of nMOS transistors (not shown), and hence may be an N+ region having a concentration, for example, greater than about $1 \times 10^{20}/cm^3$. Contact plug 48 may be formed in the ILD, and may be formed simultaneously with the formation of contact plugs (not shown) that are connected to the source/drain regions and gate electrodes of the pMOS and nMOS transistors. It is noted that deep N-well region 36 may be connected to voltage source 50 using any other applicable connections.

Voltage source 50 provides a positive bias voltage to deep N-well region 36. Accordingly, depletion region 52 is formed in the portion of substrate 30 that encloses deep N-well region 36. In an embodiment, the voltage applied to deep N-well region 36 is high enough to deplete the portion of substrate 30 directly over deep N-well region 36. In other words, depletion region 52 extends to top surface 40 of substrate 30. It is realized that parasitic capacitors 54 exist between RF transformer 32 and substrate 30. The formation of depletion region 52 has the effect of increasing the equivalent thickness of capacitor insulators of parasitic capacitors 54 by the thickness of depletion region 52. As a result, the capacitance of parasitic capacitors 54 is reduced, resulting in a reduced signal loss in substrate 30 (which signal loss is referred to as substrate loss hereinafter). In an embodiment, the total parasitic capacitance of all of parasitic capacitors 54 may be reduced by about 50 percent.

To maximize the parasitic-capacitance reduction effect, the thickness T of depletion region 52 is preferably increased, which may be achieved by increasing the positive bias voltage. In an embodiment, the bias voltage is operation voltage VDD, which is the positive power supply voltage that is provided to core circuits, although the bias voltage may also be any other positive voltage. To further increase the size of depletion region 52, the positive bias voltage may be increased to higher than voltage VDD. For example, voltage source 50 may be an input/output (I/O) voltage source providing a positive power supply voltage higher than voltage VDD.

Figure 3B:
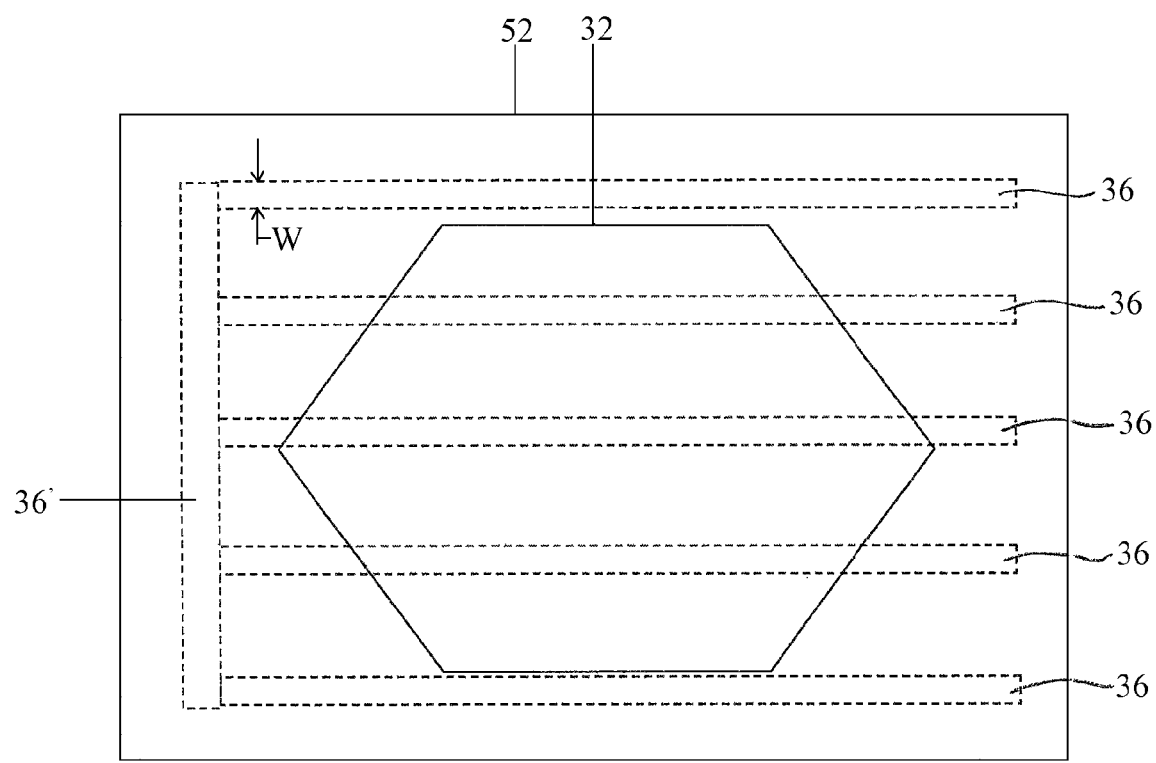

FIG. 3B illustrates an exemplary top view of RF transformer 32, deep N-well region 36, and depletion region 52. Depletion region 52 may be a continuous region that extends beyond edges of transformer 32 in all in-plane directions (the directions parallel to the surface of substrate 30). Accordingly, depletion region 52 may have an area (viewed from top) at least substantially close to, and even greater than, the area of RF transformer 32. The area of depletion region 52 may also be greater than the area of RF transformer 32 by 10 percent, or even by 100 percent. Advantageously, the increase in the area of depletion region 52 may reduce the capacitance of parasitic capacitor 54' as shown in FIG. 3A. In an embodiment, deep N-well region 36 includes a plurality of parallel fingers (also denoted as 36) that are spaced apart by portions of P– substrate 30. The parallel fingers 36 may be connected through deep N-well region 36'. In order to reduce the induced currents that may form in deep N-well region 36, the fingers are preferably as narrow as possible, with width W being close to, or even equal to the dimension defined by the minimum rule (the minimum width allowed by the forming technology). When the bias voltage is applied, the depletion regions of neighboring fingers are overlapped to form continuous depletion region 52. In alternative embodiments, deep N-well region 36 may have any other patterns, such as grids, as long as it can form continuous depletion region 52. In yet other embodiments, deep N-well region 36 may be a continuous N-well plate.

The formation of depletion region 52 results in reduced substrate loss. Simulation results have revealed that the Q-factor of RF transformer 32 may be increased from about 37 to about 45.

Figure 4:
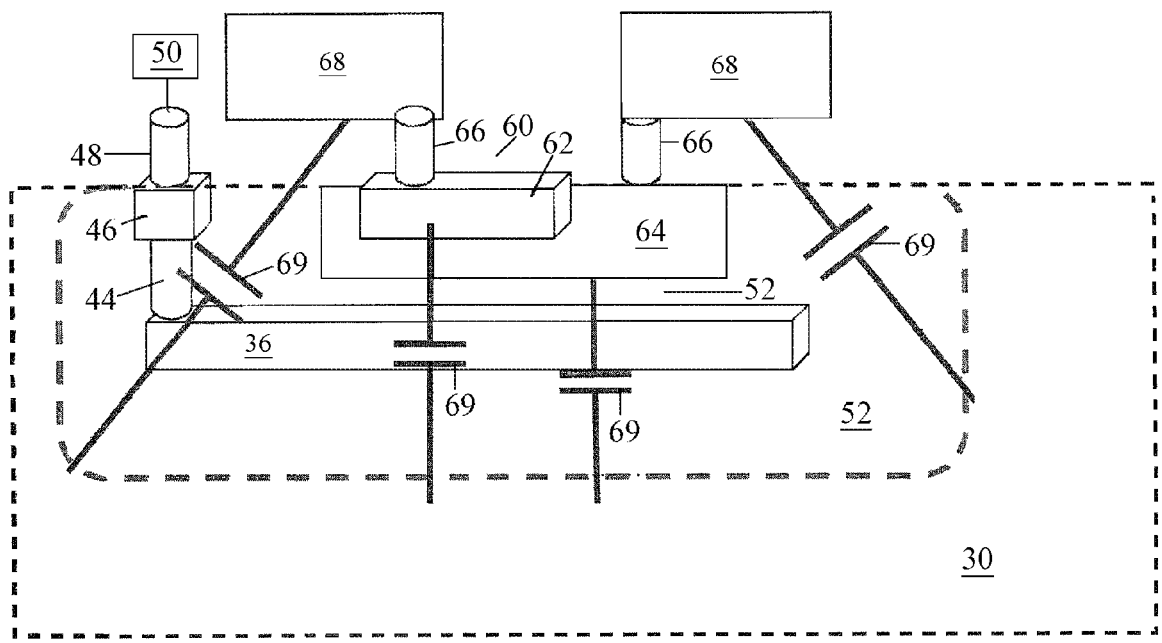
FIGS. 4, 5, and 6 illustrate cross-sectional views of a junction diode embodiment, a FinFET diode embodiment, and a Schottky diode embodiment, respectively.
Figure 5:
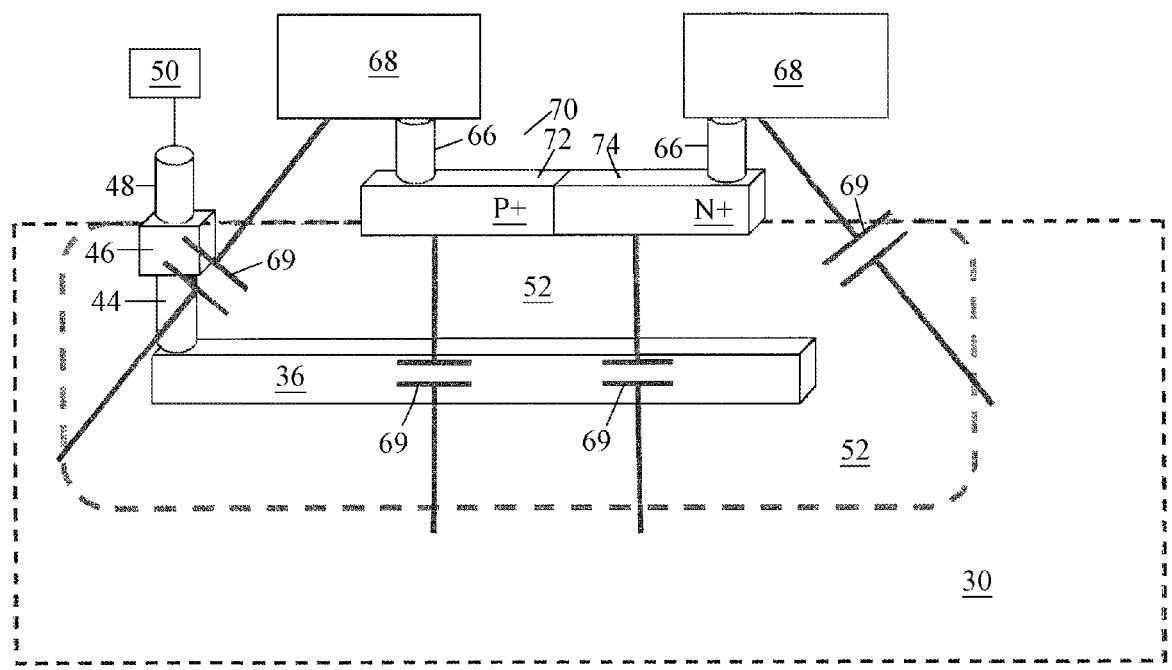
Figure 6:
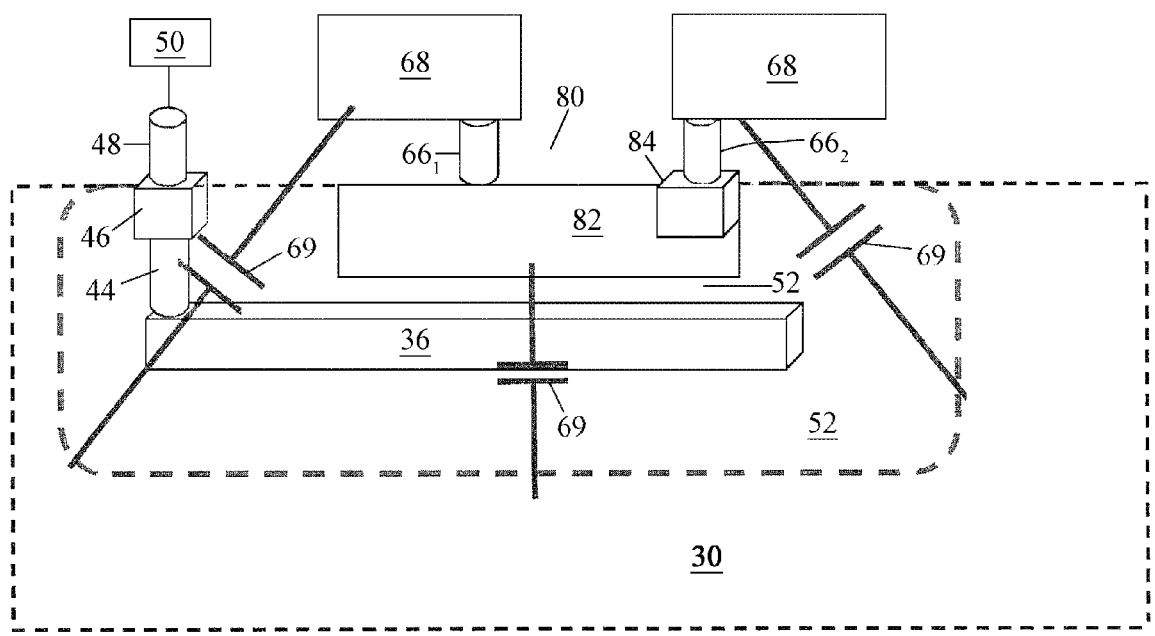

FIGS. 4 through 6 are embodiments having deep N-well regions 36 and the corresponding depletion regions 52 integrated with diodes. Throughout these embodiments, deep N-well region 36, voltage source 50, and the bias voltage applied to N-well region 36 may be essentially the same as in the embodiment shown in FIGS. 3A and 3B. For simplicity, the design details and specifications of these regions are not repeated herein. FIG. 4 illustrates junction diode 60, which is formed between P+ diffusion region 62 and N-well region 64. P+ diffusion region 62 and N-well region 64 may be formed through implanting, and hence the top surfaces of P+ diffusion region 62 and N-well region 64 may also be the top surface of substrate 30. N-well region 64 is spaced apart from deep N-well region 36 by a portion of substrate 30, which is of p-type. Similarly, depletion region 52 encloses deep N-well region 36 from top, bottom, and possibly all lateral directions. Further, depletion region 52 extends into the space between N-well region 64 and deep N-well region 36, and hence N-well region 64 and deep N-well region 36 are spaced apart from each other. Contact plugs 66 are connected to P+ diffusion region 62 and N-well region 64, and are further connected to metal lines 68, which may be formed, for example, in the bottom metallization layer (commonly known as M1). Advantageously, the capacitance of parasitic capacitors 69 between junction diode 60 and substrate 30 is advantageously reduced due to the increase in the thickness of the equivalent capacitor insulators. As a result, the substrate loss is reduced.

FIG. 5 illustrates another embodiment of the present invention, which includes Fin field-effect transistor (FinFET) diode 70 formed over substrate 30. FinFET diode 70 includes P+ diffusion region 72 (also referred to as fin 72) and N+ diffusion region 74 (also referred to as fin 74) contacting each other to form a P-N junction. P+ diffusion region 72 and N+ diffusion region 74 may have bottom surfaces contacting the top surface of substrate 30. Contact plugs 66 and metal lines 68 are formed to connect to diffusion regions 72 and 74. P+ diffusion region 72 and N+ diffusion region 74 are spaced apart from deep N-well region 36 by a portion of substrate 30, which may be of p-type. Similarly, depletion region 52 substantially encloses deep N-well region 36 from top, bottom, and may be all lateral directions. Further, depletion region 52 separates P+ diffusion region 72 and N+ diffusion region 74 from deep N-well region 36.

FIG. 6 illustrates yet another embodiment of the present invention, which includes Schottky diode 80 formed over depletion region 52. Schottky diode 80 is formed between N-well region 82 and metal contact plug 661, which may include tungsten, and may be formed simultaneously with the formation of contact plug 48 and $66_2$. N+ region 84 is formed in N-well region 82, and acts as the pickup region of N-well region 82. Again, a p-type region exists between N-well region 82 and deep N-well region 36, which p-type region is depleted when the bias voltage from voltage source 50 is applied.

In the embodiments as shown in FIGS. 4 through 6, depletion region 52 may have an area at least substantially close to, and more preferably greater than, the area of the respective overlying diodes 60, 70, and 80. The area of depletion region 52 may also be greater than the area of the respective overlying diodes 60, 70, and 80 by about 10 percent, or about 30 percent, or even by about 100 percent. Accordingly, besides overlapping substantially all of overlying diodes 60, 70, and 80 (FIGS. 4, 5, and 6, respectively), depletion regions 52 may further horizontally extend beyond the edges of overlying diodes 60, 70, and 80 at least in some, possibly all, lateral directions.

Although in the embodiments discussed in the preceding paragraphs, positive voltages are used to bias deep N-well regions 36 to form depletion regions in p-type substrate 30, in alternative embodiments, the conductivity types of regions 30, 36, 44, 46, 48, and/or the regions for forming the diodes, may be inversed. In this case, deep well regions 36, which are now of p-type, may be biased with negative voltages to form depletion regions 52.

Figure 7:
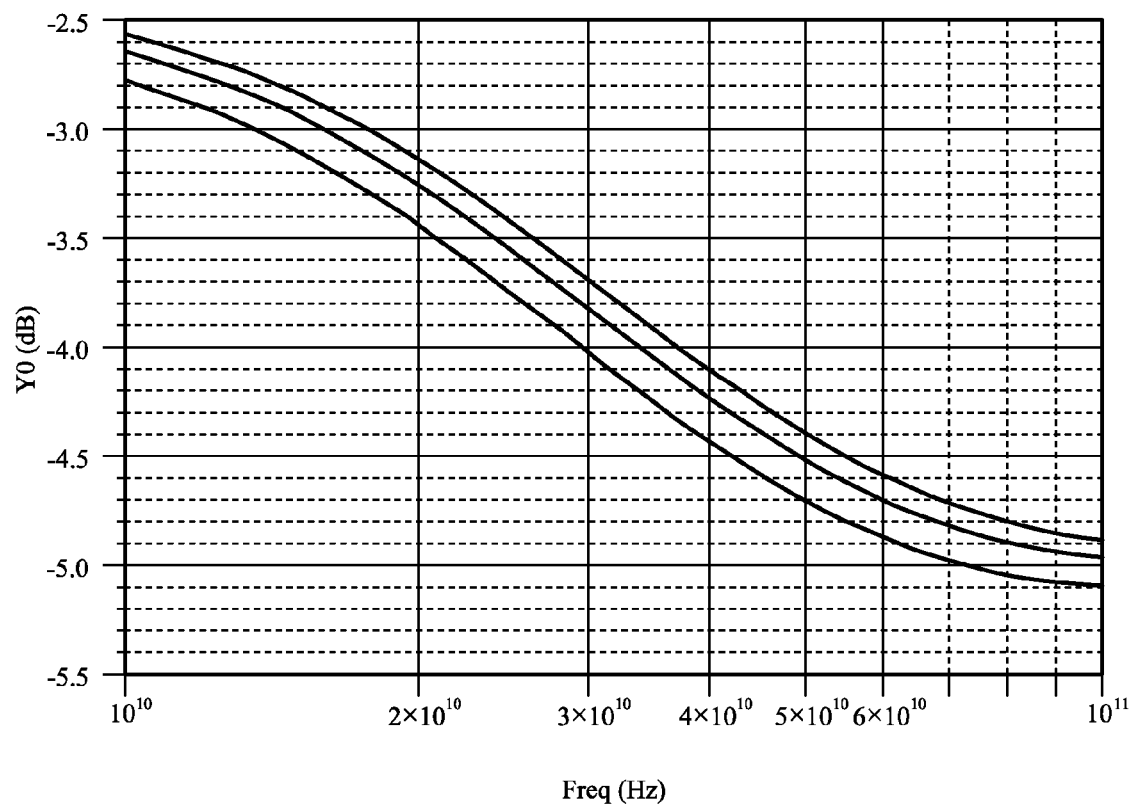
FIGS. 7 and 8 show the comparison of simulation results obtained from conventional diodes and the diode embodiments of the present invention.
Figure 8:
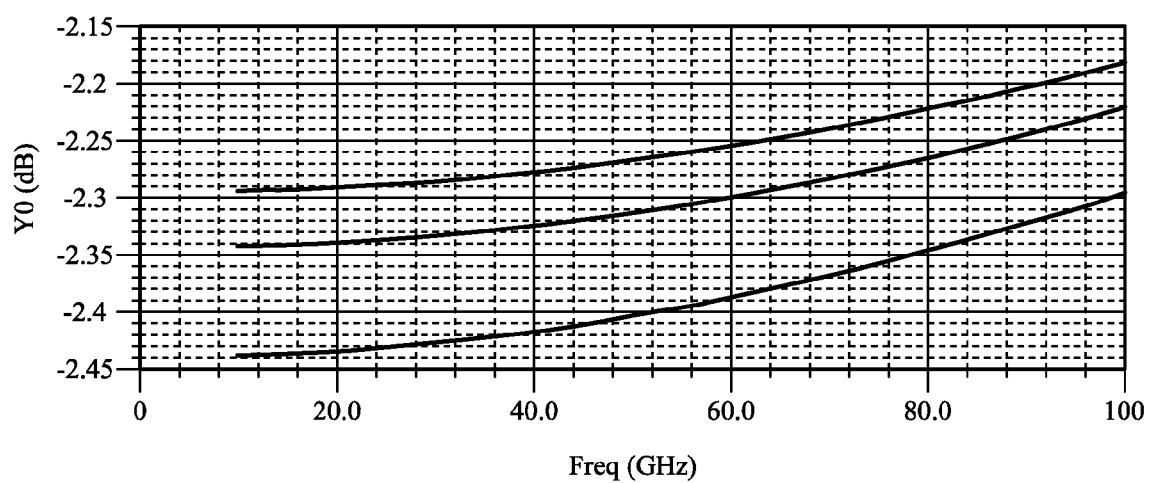

FIGS. 7 and 8 illustrate simulation results for diodes, wherein substrate losses (Y-axis) are illustrated as functions of frequencies (X-axis). FIG. 7 is obtained from samples having conventional structures with no depletion regions underlying the diodes. It is noted that at about 67 GHz, the substrate losses are between about 4.5 and about 5 decibels. With the increase of the frequencies, the substrate loss becomes more severe. As a comparison, FIG. 8 is obtained from samples of the embodiments of the present invention. It is noted that at about 67 GHz, the substrate losses are between about 2.2 and about 2.4 decibels, which is significantly lower than the substrate loss as shown in FIG. 7. A further advantageous feature of the embodiments of the present invention is that with the increasing of the frequencies, no increase in substrate loss has been observed. This means that the operation frequencies of the embodiments of the present invention can be extended into higher frequency ranges.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment and the combination of various claims and embodiments are within the scope of the invention.

What is claimed is:

1. An integrated circuit structure comprising:
   a semiconductor substrate of a first conductivity type;
   a deep well region of a second conductivity type opposite the first conductivity type in the semiconductor substrate, wherein the deep well region comprises a plurality of fingers, with portions of the semiconductor substrate extending into spaces between the plurality of fingers, and wherein the plurality of fingers is interconnected to form the deep well region;
   a depletion region in the semiconductor substrate and adjoining the deep well region, wherein the depletion region comprises portions formed by the plurality of fingers, and wherein the portions of the depletion region are overlapped to form a continuous depletion region;
   a voltage source connected to the deep well region, wherein the voltage source is configured to provide a fixed positive voltage to the deep well region; and
   an integrated circuit device directly over the depletion region.

2. The integrated circuit structure of claim 1, wherein the deep well region is of n-type, and wherein a portion of the semiconductor substrate directly over the deep well region and a portion of the semiconductor substrate directly under the deep well region are of p-type.

3. The integrated circuit structure of claim 1, wherein the fixed positive voltage is a positive power supply voltage of a core circuit.

4. The integrated circuit structure of claim 1, wherein the fixed positive voltage is a positive power supply voltage of an input/output circuit.

5. The integrated circuit structure of claim 1, wherein the integrated circuit device is a radio frequency (RF) transformer.

6. The integrated circuit structure of claim 5 further comprising a dielectric layer over the semiconductor substrate and spacing the depletion region apart from the RF transformer.

7. The integrated circuit structure of claim 1, wherein the integrated circuit device is a diode.

8. The integrated circuit structure of claim 7, wherein the diode is a junction diode comprising a first well region in the semiconductor substrate, and a second well region in the first well region, wherein the first well region and the second well region are of opposite conductivity types.

9. The integrated circuit structure of claim 7, wherein the diode is a FinFET diode comprising a first fin region over the semiconductor substrate, and a second fin region over the semiconductor substrate and contacting the first fin region, and wherein the first fin region and the second fin region are of opposite conductivity types.

10. The integrated circuit structure of claim 7, wherein the diode is a Schottky diode.

11. The integrated circuit structure of claim 1, wherein the depletion region has an area substantially no less than an area of the integrated circuit device.

12. The integrated circuit structure of claim 1, wherein the deep well region comprises a plurality of deep well fingers parallel to each other.

13. The integrated circuit structure of claim 12, wherein widths of the plurality of deep well fingers are close to a minimum width of a technology for forming the integrated circuit structure.

14. An integrated circuit structure comprising:
a semiconductor substrate of a first conductivity type;
a diode;
a deep well region in the semiconductor substrate and directly under the diode, wherein the deep well region is of a second conductivity type opposite the first conductivity type;
a voltage source connected to the deep well region and configured to provide a fixed positive voltage to the deep well region, wherein the fixed positive voltage is selected from the group consisting of a positive power supply voltage of a core circuit and a positive power supply voltage of an input/output circuit; and
a depletion region comprising a first portion directly over the deep well region and a second portion directly under the deep well region, wherein the first portion spaces the deep well region apart from the diode.

15. The integrated circuit structure of claim 14, wherein the first portion and the second portion of the depletion region are portions of a continuous depletion region substantially enclosing the deep well region.

16. The integrated circuit structure of claim 14, wherein the diode is a junction diode comprising a first well region in the semiconductor substrate, and a second well region in the first well region, wherein the first well region and the second well region are of opposite conductivity types.

17. The integrated circuit structure of claim 14, wherein the depletion region extends to a top surface of the semiconductor substrate, wherein the diode is a FinFET diode comprising a first fin region over the semiconductor substrate, and a second fin region over the semiconductor substrate and contacting the first fin region, and wherein the first fin region and the second fin region are of opposite conductivity types.

18. The integrated circuit structure of claim 14, wherein the diode is a Schottky diode comprising:
a doped semiconductor region in the semiconductor substrate; and
a metal contact plug contacting the doped semiconductor region.

19. The integrated circuit structure of claim 14, wherein the first conductivity type is n-type, the second conductivity type is p-type, and wherein the voltage source is configured to provide a negative voltage.

20. The integrated circuit structure of claim 14, wherein the depletion region has an area substantially no less than an area of the diode.

21. The integrated circuit structure of claim 20, wherein the area of the depletion region is greater than the area of the diode, and wherein the depletion region substantially laterally extends beyond respective edges of the diode in all lateral directions.

22. The integrated circuit structure of claim 14, wherein the deep well region comprises a plurality of deep well fingers, with the depletion region extending to between the plurality of deep well fingers.

23. The integrated circuit structure of claim 14, wherein the deep well region comprises a plurality of deep n-well fingers parallel to each other, and an additional n-well strip interconnecting the plurality of deep n-well fingers.

24. An integrated circuit structure comprising:
a semiconductor substrate of a first conductivity type;
a depletion region in the semiconductor substrate;
a deep well region substantially enclosed by the depletion region, wherein the deep well region is of a second conductivity type opposite the first conductivity type, and wherein the depletion region comprises a first portion directly over the deep well region and a second portion directly under the deep well region;
a voltage source connected to the deep well region, wherein the voltage source is configured to provide a fixed positive voltage to the deep well region, and wherein the fixed positive voltage is selected from the group consisting of a positive power supply voltage of a core circuit and a positive power supply voltage of an input/output circuit; and
an integrated circuit device directly over the depletion region.

* * * * *